United States Patent [19]

Peppel et al.

[11] Patent Number: 4,674,023

[45] Date of Patent: Jun. 16, 1987

[54] METHOD AND APPARATUS FOR RECOGNIZING THE CUTOFF STATE OF A THYRISTOR WHICH CAN BE SWITCHED OFF

[75] Inventors: Michael Peppel, Uttenreuth; Theodor Salzmann, Erlangen, both of Fed. Rep. of Germany

[73] Assignee: Siemens Aktiengesellschaft, Munich, Fed. Rep. of Germany

[21] Appl. No.: 872,953

[22] Filed: Jun. 11, 1986

[30] Foreign Application Priority Data

Jun. 19, 1985 [DE] Fed. Rep. of Germany ....... 3521920
Oct. 17, 1985 [DE] Fed. Rep. of Germany ....... 3537050

[51] Int. Cl.⁴ .......................................... H02H 7/122
[52] U.S. Cl. .................... 363/57; 307/252 C; 361/86; 361/100; 363/54; 324/158 SC
[58] Field of Search ............... 363/54, 57, 58; 324/158 SC; 307/252 C; 361/86, 100

[56] References Cited

U.S. PATENT DOCUMENTS 4,384,248 5/1983 Matsuda et al. ...................... 363/58
4,600,917 7/1986 Seki et al. ............................ 363/54

*Primary Examiner*—Patrick R. Salce
*Assistant Examiner*—Anita M. Ault
*Attorney, Agent, or Firm*—Kenyon and Kenyon

[57] ABSTRACT

For recognizing the blocked state of a thyristor which can be switched off (GTO thyristor), especially also if it is alloyed through or the driver addressing the thyristor is defective, a state signal indicating the actual advent of the blocked state is generated after the occurrence of a turn-off signal, if the derivative in time of the gate current has exceeded a positive upper limit, which indicates that the thyristor has been turned off successfully. The maxima of the derivative in time of the gate current are almost independent of the actual anode-cathode current to be extinguished. The derivitive in time of the gate current is advantageously determined via a coupling inductance. Preferably, the method and apparatus are used with a mutual adaptive turn-on interlock of GTO thyristors in converter equipment and can be urged to release protective measures in time if permanent conduction (short circuiting) of a thyristor occurs.

17 Claims, 8 Drawing Figures

METHOD AND APPARATUS FOR RECOGNIZING THE CUTOFF STATE OF A THYRISTOR WHICH CAN BE SWITCHED OFF

BACKGROUND OF THE INVENTION

The present invention relates to a method and apparatus for recognizing the cutoff state of a thyristor that can be switched off (GTO thyristor), especially also after an unsuccessful attempt to switch it off if the thyristor is alloyed-through (shorted), by forming after the occurrence of a "turn-off" signal, a state signal indicating the advent of the cutoff state from the derivitive in time of the gate current.

Such a method is preferably applied in converter circuits with GTO thyristors (gate turnoff thyristors), for instance, in bridge arrangements in which the mutual relief of the thyristors during conduction is to take place in optimum time during the current commutation from one bridge arm half to the other. For preventing a short circuit, pauses must be observed between the individual thyristor firing signals so that even for a short transition time, both thyristors of a bridge arm never carry current at the same time. These pauses, however, depend not only on the prevailing operating state of the thyristor, characterized by its actual barrier layer temperature, the forward blocking voltage and the forward current, but also on its external wiring which is necessary for safe operation and which preferably serves for facilitating the switching. The value of the minimum permissible pause period is basically obtained from the worst operating point with maximum thyristor quenching time, possibly taking the time behavior of the additional switching relief devices of their own into consideration. However, along with this goes an overall non-optimum operating behavior of the converter. If, on the other hand, the method according to the present invention is used, these pauses are reduced, by an adaptive mutual interlock of the thyristor "on" signals, to a minimum value which is necessary for the prevailing operating state of the thyristors and their external wiring. The relief in the conduction can now take place in optimum time since the instant of the advent of the blocking switching state of the thyristor to be relieved is actually recognized and need not be estimated by means of a so-called worst-case consideration.

Especially also in the event of a defect when permanent conductance between the anode and the cathode of the GTO thyristor due to the alloying-through of the semiconductor layers occurs, protective measures can be initiated in time by the application of the method according to the invention if the state signal characterizing the cutoff state fails to arrive. Besides triggering trouble messages, it is particularly important here to suppress the "on" signal for a further still intact thyristor in the arm of a bridge circuit for preventing a short circuit.

In German Patent Application No. P 34 34 607.4, three methods for recognizing the current-blocking switching state have been described for the operation of GTO thyristors.

Thus, in the first of the proposed methods, after the occurrence of an "off" command, the negative voltage between the gate and the cathode of the thyristor is determined and a state signal characterizing the advent of the cutoff state is formed if the gate-cathode voltage falls below a negative threshold.

A second method determines, instead of the gate cathode voltage at the thyristor, the negative control current flowing in its gate terminal during the switching off process and forms the state signal characterizing the advent of a blocking state if the derivative in time of the controlling gate current changes its sign after the occurrence of an "off" command.

In a third method, the state signal is formed in a further development of the second method, if either the derivative in time of the gate current changes its sign and the gate current itself has fallen below a negative threshold or the derivative in time of the gate current, while it has changed its sign, has not fallen below the negative threshold within a predetermined time.

With the aid of the internal behavior of the control circuit during the switching-off process, for instance, by means of the voltage drop caused by the negative control current at the output of the addressing unit, in the following called the driver, due to an output impedance different from zero, conclusions can be drawn as to the instantaneously flowing gate current and its derivative in time, so that the actual switching state and, in particular, the cutoff state, can be recognized.

The necessary minimizing of the actual undesired voltage drop at the output of the driver, however, requires overall a relatively small signal-to-noise margin of the signals to be evaluated. In addition, variations of the amplitude of the negative gate current which depends on the magnitude of the actual anode-cathode current of the thyristor can lead to a further reduction of the already small voltage drop. These circumstances can make the timely recognition of a permanent short circuit within the thyristor due to alloying-through of the semiconductor layers more difficult in some cases, for instance, if after a "turn-off" command, the cutoff state actually does not occur.

SUMMARY OF THE INVENTION

It is consequently an object of the present invention to recognize the advent of the current blocking switching state in a different and particularly simple and reliable manner. Especially it should be possible to recognize reliably in the event of a defect of the GTO thyristor that permanent conduction between the anode and the cathode exists and consequently the preceding attempt to switch off was not successful. Finally, the actually prevailing switching state of the thyristor is to be indicated correctly also in the event of malfunctioning of the driver which addresses the thyristor between its gate-cathode path. This is important particularly if the thyristor cannot execute a "turn-off" command present because of a driver defect.

The above and other objects of the present invention are achieved by a method for recognizing the cutoff state of a thyristor which can be switched off (gate turn-off—GTO thyristor) and for determining if the thyristor is alloyed-through after an unsuccessful turn-off attempt, comprising the steps of forming, after a turn-off signal has been supplied to the gate of the thyristor, a state signal characterizing the occurrence of the shut-off state from the derivative in time of the gate current, and providing said state signal when the sign of the derivative in time of the gate current reverses and exceeds a predetermined positive limit which is chosen larger than the maximum positive value of the derivative in time of the gate current during a turn-off attempt occurring in the case of a GTO thyristor which is alloyed-through.

In a further embodiment of the invention there is generated with the occurrence of a "turn-off" signal at the output of a driver which is connected to the gate and cathode electrode of the thyristor, a negative switching voltage which initiates the switching-off of the thyristor, and it is particularly advantageous that the process of forming the state signal is released if this switching voltage has fallen below a suitably chosen lower threshold. The lower threshold is preferably chosen, taking into consideration parasitic inductances internal to the driver, in such a manner that the value is reliably lower than the negative switching voltage at the instant of the occurrence of the "turn-off" signal if the driver works properly.

In a further embodiment of the invention, it is advantageous that a state signal is not released as long as an adjustable running (delay) time started with the beginning of the process of forming the state signal is not yet ended and/or after the derivative in time of the gate current at the beginning of the switching-off process has fallen below a given negative limit. The predeterminable limit and the adjustable running time are matched to each other in such a way that the derivative in time of the gate current has fallen below the negative limit before the running time has ended.

It is further of particular advantage overall for increasing the interference resistance if, for preventing erroneous triggering of the state signal, the effect of pulse-like disturbances of the gate current is filtered out, and/or if simultaneously with the end of the thyristor "turn-off" signal, the formation of the state signal is blocked.

A suitable and preferably used device for forming the state signal indicating the blocked state consists of a differentiating measuring transmitter which forms the derivative in time of the gate current and of a Schmitt trigger with a settable positive and negative switching limit which derives from the derivative in time of the gate currents a binary signal which is linked via a logical AND stage with an auxiliary signal to the state signal, wherein a signal transmitter forms the auxiliary signal directly from the thyristor "turn-off" signal with delayed closing via an adjustable running time.

A further particularly suitable device for forming the state signal indicating the blocked state consists of a driver which is addressed by the "turn-off" signal and supplies the thyristor with a negative switching voltage between its gate and cathode electrode, a differentiating measuring transmitter which forms the derivative in time of the gate current, a Schmitt trigger with a settable positive and negative switching limit which derives from the derivative in time of the gate current a binary signal, a signal transmitter which generates an auxiliary signal with delayed switching on via an adjustable running time, which is triggered by the inverting output of a comparator which monitors the switching voltage at the output of the driver for an adjustable lower threshold, and a logical AND stage which links a binary signal and the auxiliary signal to form a state signal.

It is of particular advantage if in addition, a time delay stage serves as a filter element for suppressing temporary changes of the binary signal which are caused by pulse-like disturbances of the gate current and which are shorter than a filtering time which can be set via the time delay stage, whereby erroneous triggering of the state signal is prevented. Preferably, also means for blocking the state signal at the end of the thyristor "turn-off" signal by deactivating the Schmitt trigger input are used.

Particularly well suited for use as a differentiating measuring transmitter is a coupling inductance which is permeated by the magnetic field of a primary winding carrying gate current and which is preferably designed as a two-dimensional structure on a circuit board.

BRIEF DESCRIPTION OF THE DRAWINGS

The invention will be explained in greater detail in the following detailed description with reference to the drawings, in which.

DETAILED DESCRIPTION

Figure 1:
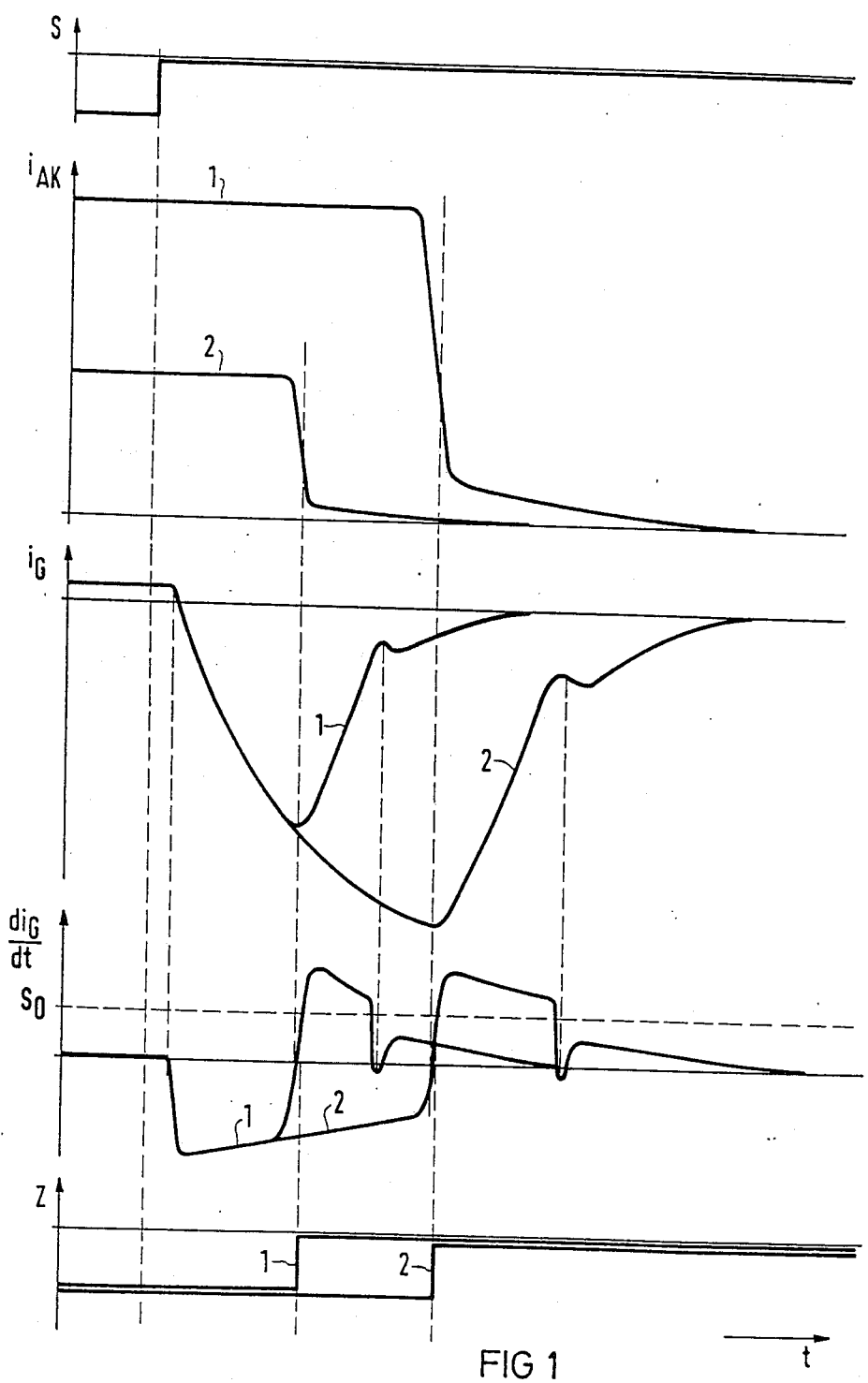
FIG. 1 shows generally the waveforms of electrical state variables and the formation of the state signal for successful disconnection of a GTO thyristor, for two anode-cathode currents of different magnitude.
Figure 2:
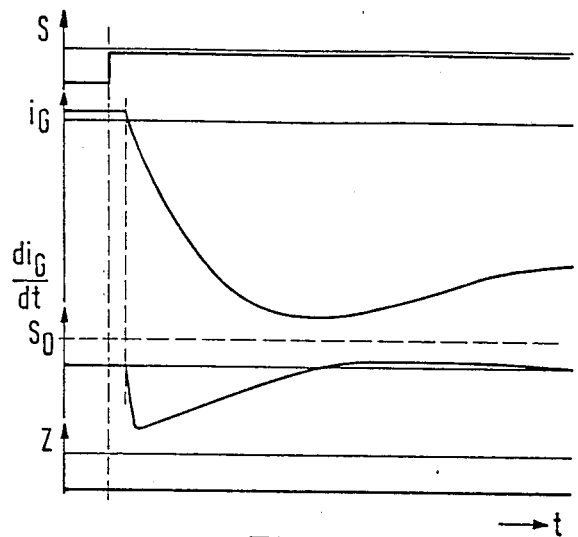
FIG. 2 shows generally the waveforms of electrical state variables for an unsuccessful disconnect attempt of a defective GTO thyristor.

With reference now to the drawings, if a switching-off signal (turn-off) S is present, the waveforms of the gate current i and its derivative in time for an intact and a defective GTO thyristor are shown in FIGS. 1 and 2.

FIG. 1 shows the signals simultaneously for switching off two anode-cathode currents $i_{AK}$ of different magnitude in the form of two families of curves which are indicated by the reference numerals 1 and 2. It is seen that the maxima of the derivative in time $di_G/dt$ of the gate current $i_G$ for switching off an intact GTO thyristor are relatively independent of the actual value of the anode-cathode current to be switched off. Thus, the steeply rising edge of the gate current, after exceeding its relative minimum, is generally a sure sign for the actual advent of the current-blocking switching state, and the failure of this edge to arrive is a sure sign that the semiconductor layers have been shorted or alloyed through.

While, therefore, the switching off proceeds as intended in FIG. 1, and the state signal Z is formed in the vicinity of the rising negative gate current which decays in the direction toward the value zero after passing its absolute minimum if its derivative in time has exceeded a positive threshold $S_O$, the switching-off, in contrast, remains unsuccessful in FIG. 2. As shown in FIG. 2, the gate current settles to a steady-state negative value, the minimum is by far not as pronounced as in the case of an intact thyristor, and the following rise to the steady state continuous current is relatively slow.

If now particularly the positive threshold $S_O$ for the derivative in time of the gate current is chosen larger than the change in time of the gate current which occurs maximally in the attempt to disconnect an alloyed through GTO thyristor according to FIG. 2, the actual advent of the blocked state or its failure to arrive can be determined from a state signal Z which is derived when this threshold is exceeded.

It is the advantage of the method according to the invention that the evaluation of the derivative of the gate current in time alone is sufficient for a simple and reliable recognition of the blocked state of the GTO. Since the method is independent of the magnitude of the thyristor current to be quenched, uniformly high interference resistance is obtained which is independent of the operating point. It can further be translated with little expenditure into a practical embodiment.

Figure 3:
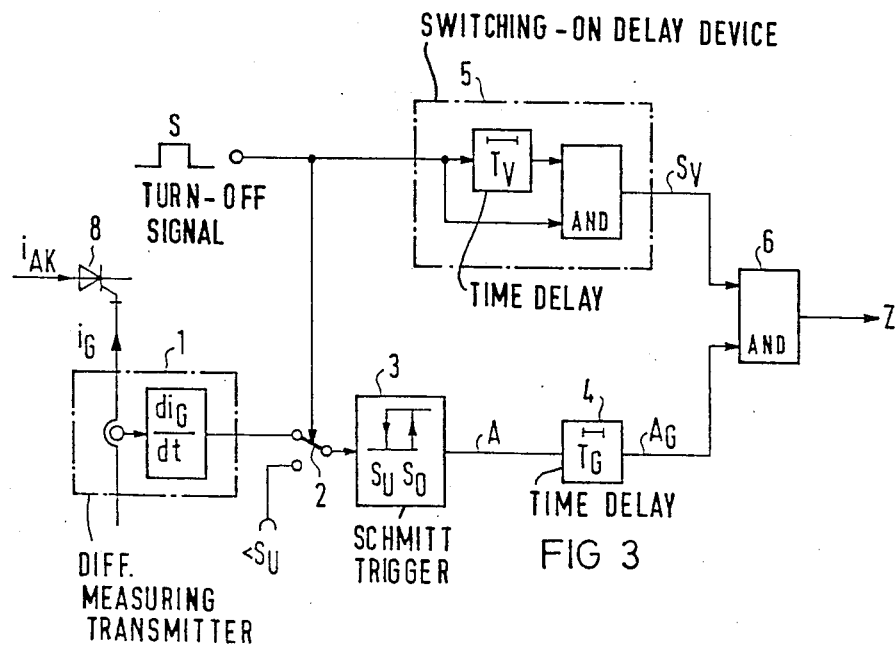
FIG. 3 is a block diagram of a preferred device for carrying out the method according to the invention.

FIG. 3 shows in block diagram form a preferably used device for forming the state signal Z. In the two following figures the electrical state variables important for switching-off the thyristors and all corresponding intermediate signals are shown, in FIG. 4 for the case of a successful thyristor turn-off with subsequent reclosing, and correspondingly in FIG. 5, for an unsuccessful opening.

According to FIG. 3, a differentiating measuring transmitter 1 forms the derivative in time of the gate current. This derivative is applied via a switching element 2 which is closed in the presence of an active turn-off signal S, to the input of a Schmitt trigger 3 having a settable positive and negative switching limit $S_O$ and $S_U$, and is changed into a binary signal A. A time delay stage 4 with an identical on and off delay time $T_G$ changes this signal into the signal $A_G$ and forms the state signal Z proper via a logical AND stage 6, linked with an auxiliary signal $S_V$. The time delay member 4 serves as a kind of filter element with a settable filtering time $T_G$. Possible pulse-like disturbances of the gate current $i_G$ which are noted especially in its derivative in time and lead to a condition that the Schmitt trigger 3 temporarily changes the logical state of its output signal A, are not passed on to the signal $A_G$. If the original state of the output signal A has readjusted itself prior to the end of the time $T_G$, false triggering of the state signal Z is therefore avoided.

The same purpose is served by the switching element 2 inasmuch as it inhibits the formation of the state signal Z by deactivation of the Schmitt trigger input if an active state signal Z basically makes no sense because of the absence of a thyristor "turn-off" signal S.

Even after the occurrence of a switching-off signal S, the formation of the state signal Z is inhibited for an adjustable time $T_V$ via the AND logic 6 by the auxiliary signal $S_V$ which is derived via the switching-on delay device 5 from the switching-off signal S itself. The formation of the state signal Z consequently is made possible if, after the presence of the switching-off signal S, the switching-off process has come into full operation and the occurrence of the current blocking switching state has become probable.

Figure 4:
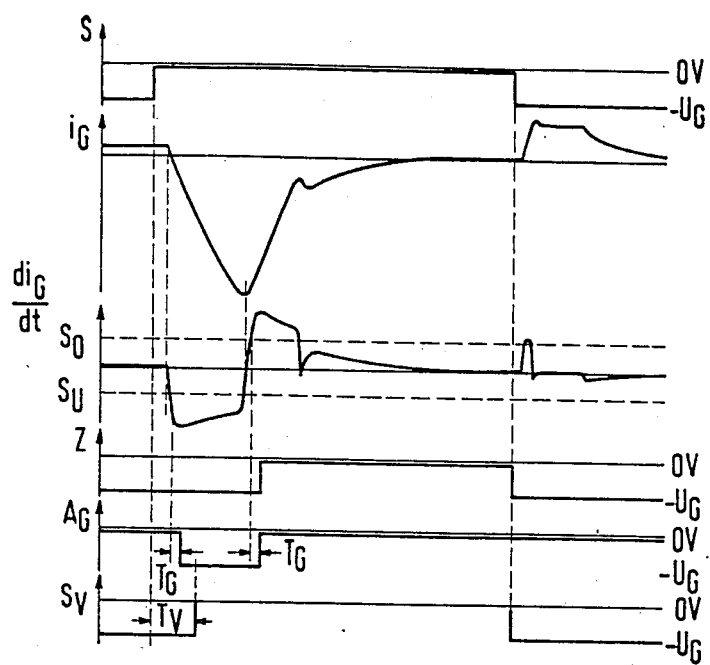
FIG. 4 shows specifically, the waveforms of electrical state variables and signals for successfully disconnecting with subsequent reconnection of a GTO thyristor, using the method according to the invention.

In FIG. 4, this is clarified further, wherein besides the gate current $i_G$ and its derivative in time, also the auxiliary signal $S_V$ delayed by time $T_V$, the filtered Schmitt trigger output signal $A_G$ and the state signal Z are shown for the case of a successful GTO switching-off operation with subsequent reclosing. At the right figure margin, the designations $-U_G$ indicate the logically inactive, and 0V the logically active signal level of the respective signal.

After the arrival of a switching-off signal S, the formation of the state signal Z is possible at the earliest after the expiration of the adjustable delay time $T_V$ with the rising edge of the auxiliary signal $S_V$. Then, the switching-off process is in full operation and the gate current approaches its absolute minimum with a steeply falling edge. Before, the Schmitt trigger had been switched to the logically inactive state when the value fell below the negative switching threshold $S_U$ due to the derivative in time of the gate current, which can be seen from FIG. 4 by the falling edge of the signal $A_G$ delayed by $T_G$. The adjustable delay time $T_V$ and the settable negative switching limit $S_U$ must be matched to each other so that an active state signal Z is not erroneously triggered briefly by the fact that the delay time has already ended before the derivative in time of the gate current has fallen below the negative switching threshold $S_U$. A sure sign for a successfully proceeding switching-off operation is the steep recurrent rise to the value zero of the gate current after its negative minimum. Such a steep slope occurs only if the GTO thyristor is intact and marks approximately the advent of the current blocking switching state. Accordingly, the subsequent passage of the upper threshold $S_O$ by the derivative in time of the gate current $i_G$ after the zero crossing is utilized for forming the state signal Z, especially since the steep recurrent rise of the gate current is relatively independent of the magnitude of the thyristor current $i_{AK}$ which is actually to be quenched.

Figure 5:
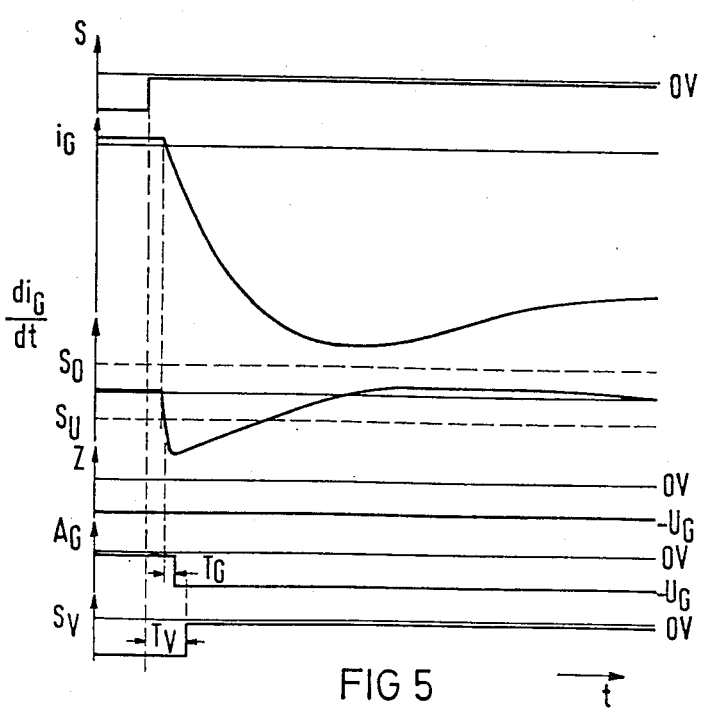
FIG. 5 shows specifically, the waveforms of electrical state variables and signals for an unsuccessful attempt to switch off a defective GTO thyristor, using the method according to the invention.

Since this steep recurrent rise is lacking if a thyristor is alloyed through, as shown in FIG. 5, and the gate current $i_G$ settles only slowly to a negative steady-state value, the change in time of the gate current does not exceed in this case the upper threshold $S_O$ and the state signal is not released.

Advantageously, a further running time is additionally triggered with the appearance of a switching-off signal; this running time is chosen so long that an intact thyristor is reliably switched off before it ends. Thereby, the failure of the state signal to arrive can be monitored and, for instance, trouble signals can be released at the expiration of the running time and in particular, protective measures can be initiated.

The method according to the invention remains operative also if a gate current $i_G$ is no longer available when a very small anode-cathode current $i_{AK}$ is switched off as is the case, for instance, if a converter circuit is in the no-load state. Since the latter does not fall below the limit $S_U$ or exceed the limit $S_O$, the output signal $A_G$ of the Schmitt trigger always remains active in this case. The state signal Z is now formed as an auxiliary measure simultaneously with the rising edge of the auxiliary signal $S_V$. The time of the arrival of the current blocking switching state of the thyristor occurs before $S_V$ becomes active but then cannot be determined exactly any longer, but such behavior is fully sufficient in the no-load case.

Figure 6:
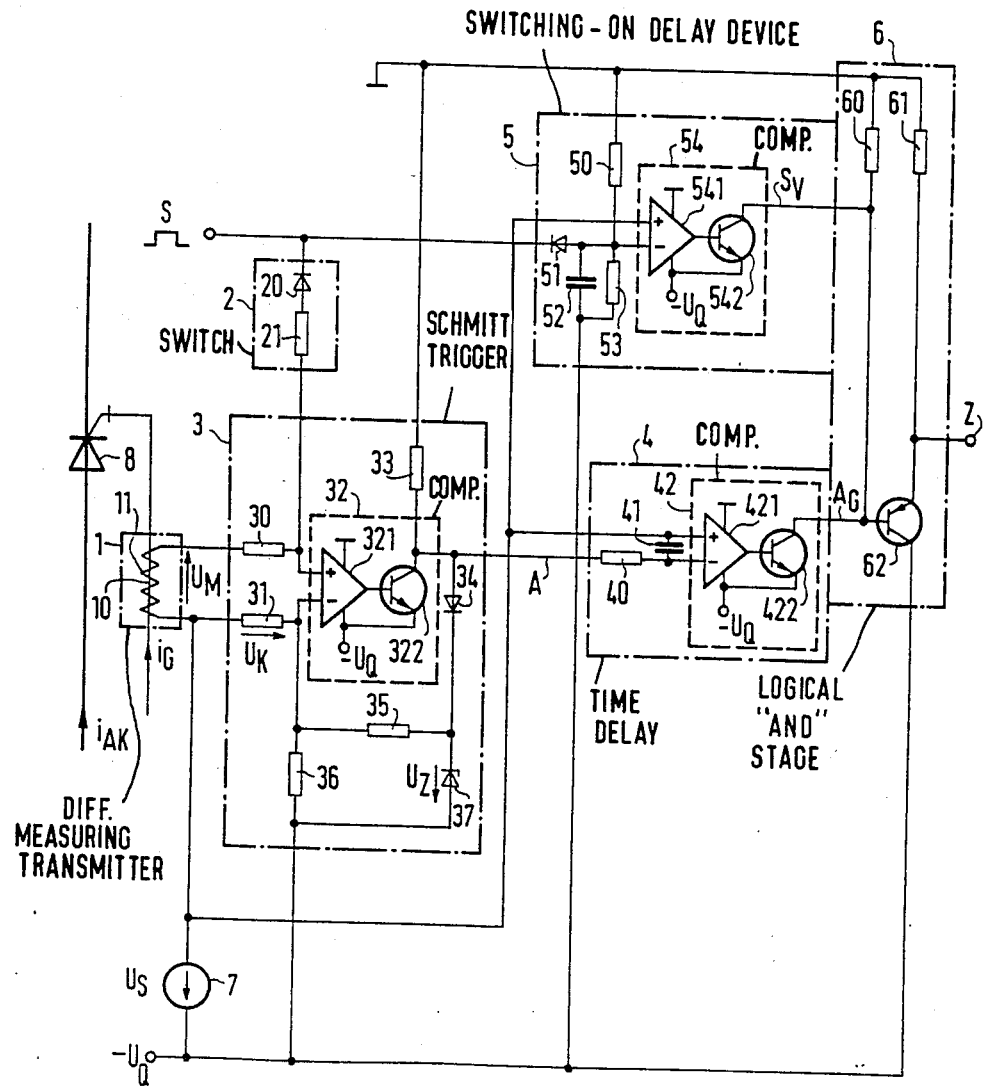
FIG. 6 is a circuit diagram of a suitable embodiment of the preferred device.

FIG. 6 shows a suitable embodiment of the preferred device according to the block diagram of FIG. 3, where also here, a signal with a voltage level near the value zero is to be considered as active and a signal with a voltage level near a negative supply voltage $U_Q$ as inactive.

Particularly advantageously, the derivative in time of the gate current is determined in the measuring transmitter 1 inductively via a coupling inductance 11 which is permeated via a primary winding 10 by the magnetic field of the gate current $i_G$ and is imaged into an auxiliary voltage $U_M$. The latter is independent of the potential relationships at the GTO thyristor itself.

A practical design of this coupling inductance can be realized in an extremely simple manner, for instance, in the form of a two-dimensional structure as a "printed coil" on a circuit board. Such arrangements are already known from high frequency technology. With a three-dimensional design as a wound coil, no requirements of any kind need be met, particularly by the coil form.

The essential part of the Schmitt trigger 3 following the differentiating measuring transmitter 1 consists of a comparator 32 comprising an operational amplifier 321 with a switching transistor 322 following in an emitter circuit, and a collector pull-up resistor 33. It is connected via the two series resistors 30 and 31, always ahead of its inverting or non-inverting inputs, to the measuring transmitter 1, the resistor 31 being additionally connected to the positive potential of an auxiliary voltage source $U_S$ which is connected with its negative potential to the negative supply voltage $U_Q$.

To generate the switching hysteresis of the Schmitt trigger, characterized by the two switching limits $S_U$ and $S_O$, the comparator 32 is fed back from its output, the collector of the switching transistor 322, to the inverting input of the operational amplifier 321 via a diode 34. The latter is arranged in series with a voltage divider consisting of resistors 35 and 36 with an antiparallel Zener diode 37 which, together with the resistor 36, is connected to the negative supply voltage $U_Q$. The inverting input is then connected between the resistors 35 and 36 to this feedback.

In particular, the positive and negative switching limits $S_O$ and $S_U$ of the Schmitt trigger are determined by a voltage drop across the series resistor 31, which depends on the respective switching state of the comparator. This voltage drop is obtained from the difference of the constant potential, augmented by the auxiliary voltage $U_S$, of the supply voltage $U_Q$ and the actual potential at the inverting input of the operational amplifier 321. This potential is determined, with the presence of the negative switching threshold $S_U$ and the transistor 322 not switched, where the signal N at the transistor collector has an active state with approximately zero potential determined by the division of the supply voltage $U_Q$ increased by the voltage $U_Z$ of the Zener diode 37 at the resistors 35 and 36. The threshold voltage $U_K$ is negative in this case as compared to the current direction shown in FIG. 6.

With the presence of the positive switching threshold $S_O$ when the transistor 322 is switched and the signal A is in a not active state with a potential near the value of the negative supply voltage $U_Q$, also the potential at the inverting operational amplifier input is approximately identical with the value of the supply voltage $U_Q$. In this case, the feedback circuit is ineffective and a positive threshold voltage $U_K$ adjusts itself.

The comparator 32 changes, for instance, in the case of a heretofore inactive output signal A into the active switching state only as soon as a positive difference voltage is present between the non-inverting and the inverting input of the operational amplifier. A positive auxiliary voltage $U_M$ caused by an increasing gate current must lift the potential at the non-inverting input, which corresponds in the rest condition to the negative supply voltage $U_Q$ increased by $U_S$ so far that it is higher than the potential of the inverting input which is obtained by the potential of the supply voltage $U_Q$ decreased by the positive switching voltage $U_K$ and increased by $U_S$. Conversely, with the output signal A active heretofore and with the presence of the negative switching limit $S_U$, a negative auxiliary voltage $U_K$ must lower the potential at the non-inverting input against the negative switching voltage $U_K$ so far that a negative difference voltage is obtained to switch the comparator.

In principle it is possible for the comparator to execute switching operations only if means for blocking the state signal are inoperative. These are shown in FIG. 3 as a switch 2 and in FIG. 6 as a series circuit connecting the non-inverting operational amplifier input to the thyristor turn-off signal S consisting of a diode 20 and a resistor 21. Thus, the diode 20 is cut off if an active thyristor turn-off signal S is present, and the non-inverting input of the operational amplifier 321 therefore remains uninfluenced. With an inactive turn-off signal S, on the other hand, so large a negative potential is present at the non-inverting input because the diode 20 conducts, so than an auxiliary signal $U_K$ of the usual magnitude cannot change the potential relationships until the switching limits are exceeded. Furthermore, the active state of the signal A is always enforced by the negative potential at the non-inverting input and the negative difference voltage resulting therefrom, which corresponds to resetting the Schmitt trigger 3.

The Schmitt trigger output signal A is converted into the smoothed signal $A_G$ by the time delay stage 4 serving as the filter element. The filtering time $T_G$ is given here by the charging-discharging time constant of an RC stage connected between the inverting and the non-inverting input of a comparator 42, consisting of a resistor 40 and a capacitor 41. The comparator 42 is realized in a manner known per se by an operational amplifier 421 terminated with a switching transistor 422 in an emitter circuit. The pull-up resistor 60 required for the switching function at the thyristor collector is contained in the following AND stage 6 which is realized by a so-called wired AND circuit and serves for addressing the base of a switching transistor 62 having an emitter resistor 61. The state signal Z indicating the current blocking switching state of the GTO thyristor is present at the output of the AND stage, the emitter of the switching transistor 62. The resistor 60 serves at the same time as the pull-up resistor for a switching transistor 542 in a comparator 54 provided at the output of the switching-on delay device 5.

The circuit 5 forms the signal $S_V$ with delayed turn-on via an adjustable delay time $T_V$ directly from the thyristor turn-off signal S. It consists of an operational amplifier 541 which is terminated by a switching transistor 542 to form a comparator 54, the inverting input of which is addressed by the turn-off signal S via a diode 51 arranged in the cutoff direction, and is connected via a resistor 50 to zero potential and, via a parallel circuit consisting of a capacitor 52 and a resistor 53 to the negative supply voltage $U_Q$. The adjustable delay time $T_V$ is determined, in the presence of a turn-off signal S, by the charging time constant of an R-C stage consisting of the capacitor 52 and the resistors 50 and 53. If the thyristor turn-off signal S disappears, on the other hand, the signal $S_V$ is switched to the inactive state almost without delay by a short-circuit-like discharge of the capacitor 52 via the diode 51.

The state signal Z, finally, is formed by a logical AND operation on the smoothed Schmitt trigger signal $A_G$ and the turn-off signal $S_V$ with delayed turn-on at the emitter of the switching transistor 62 by the provision that the collectors of the two switching transistors 422 and 542 are connected jointly to the resistor 60 and thereby address the transistor 62 between its base and emitter.

Figure 7:
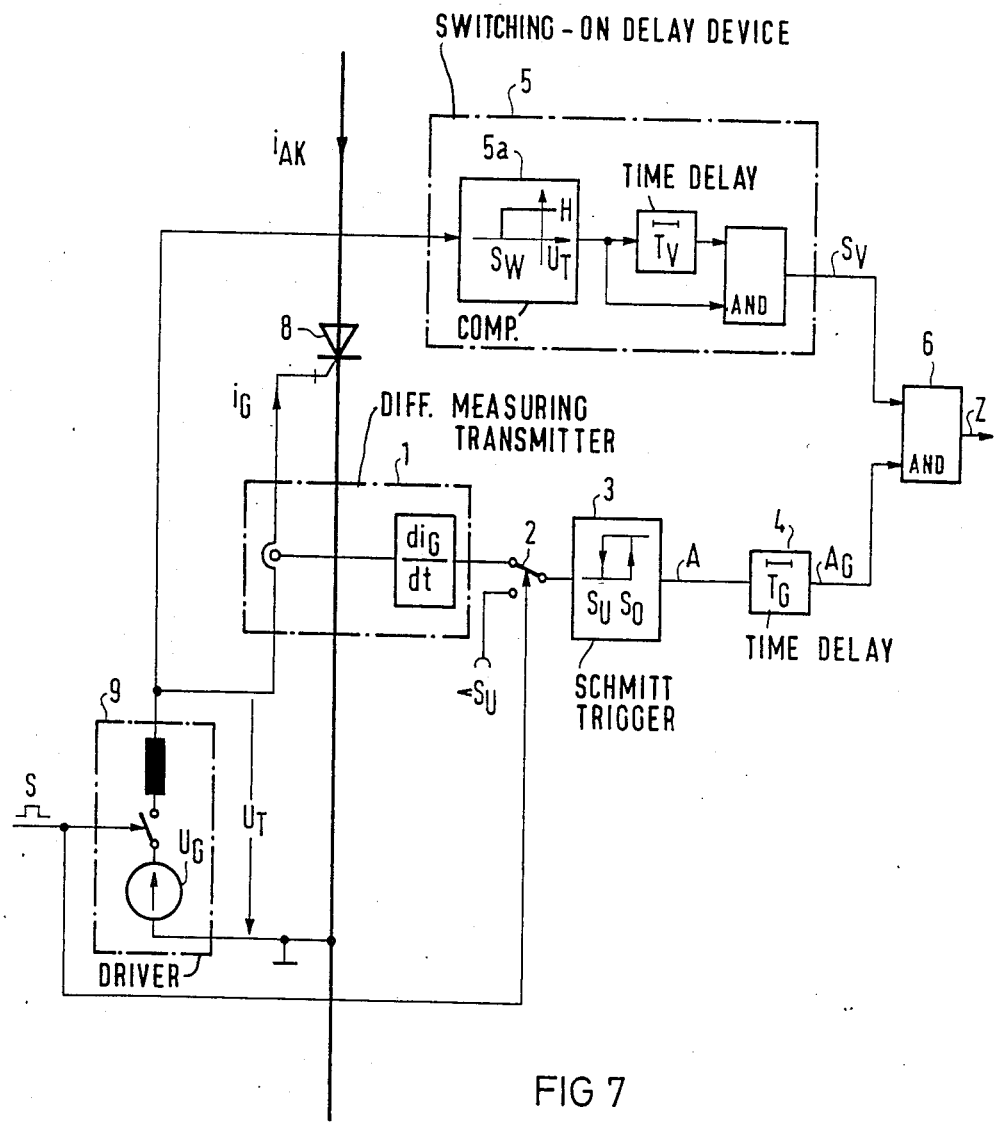
FIG. 7 is a block diagram of a further preferred device for carrying out the method according to the invention.

FIG. 7 is a block diagram of a further suitable device for forming the state signal Z. It is preferably an applied further embodiment of the arrangement of FIG. 3. In addition, a driver 9 is provided which causes with its switching voltage U appearing at its output, the thyristor 8 to be switched on and off via the gate-cathode-path thereof. To show approximately its electrical behavior required for switching the thyristor off, a series circuit consisting of a constant voltage source $U_G$, an ideal switch and an inductance is shown in its interior in FIG. 7. The inductance has the function of an equivalent component which takes the parasitic inductances internal to the driver into consideration.

If a turn-off signal S appears, the switch in the equivalent circuit diagram of the driver 9 is closed. The constant voltage $U_G$ determines the steady-state final value of the negative switching voltage $U_T$ which serves for switching off the thyristor. At the instant when the turn-off command occurs, the switching voltage $U_T$ will not yet have reached its maximum because of the parasitic inductances through which the slowly increasing negative gate current $i_G$ flows. Nevertheless, with appropriate design, the value drops at this instant below a lower threshold $S_W$ in an additional comparator 5a which monitors the switching voltage $U_T$. According to the method of the invention, the formation of the state signal Z indicating the cutoff state is released in that the inverse comparator output signal triggers the known delay time $T_V$ as the beginning of this process.

In the embodiment of FIG. 3, the formation of the state signal is released already when a "turn-off command" S occurs without the ability to determine whether the driver 9 which is likewise addressed by this signal has actually applied the switching voltage $U_T$ required for switching off the thyristor. The further embodiment of the method of the invention according to FIG. 7, on the other hand, has the special advantage that the actual switching state of the thyristor 8 is represented correctly also if the driver 9 is defective. Thus, the state signal Z also contains the monitoring of the proper functioning of the driver. By simultaneous evaluation of the turn-off signal S, the inverted output signal of the comparator 5a and the state signal Z, it is readily determined whether the cause for the failure of an active state signal to arrive results from a defect of the driver or of the GTO thyristor. Furthermore, this type of state recognition is not only independent of the proper functioning of the driver but also of its specific internal circuit structure. Except for a possible readjustment of the magnitude of the threshold value $S_W$, it can be carried out with any desired driver structure.

Figure 8:
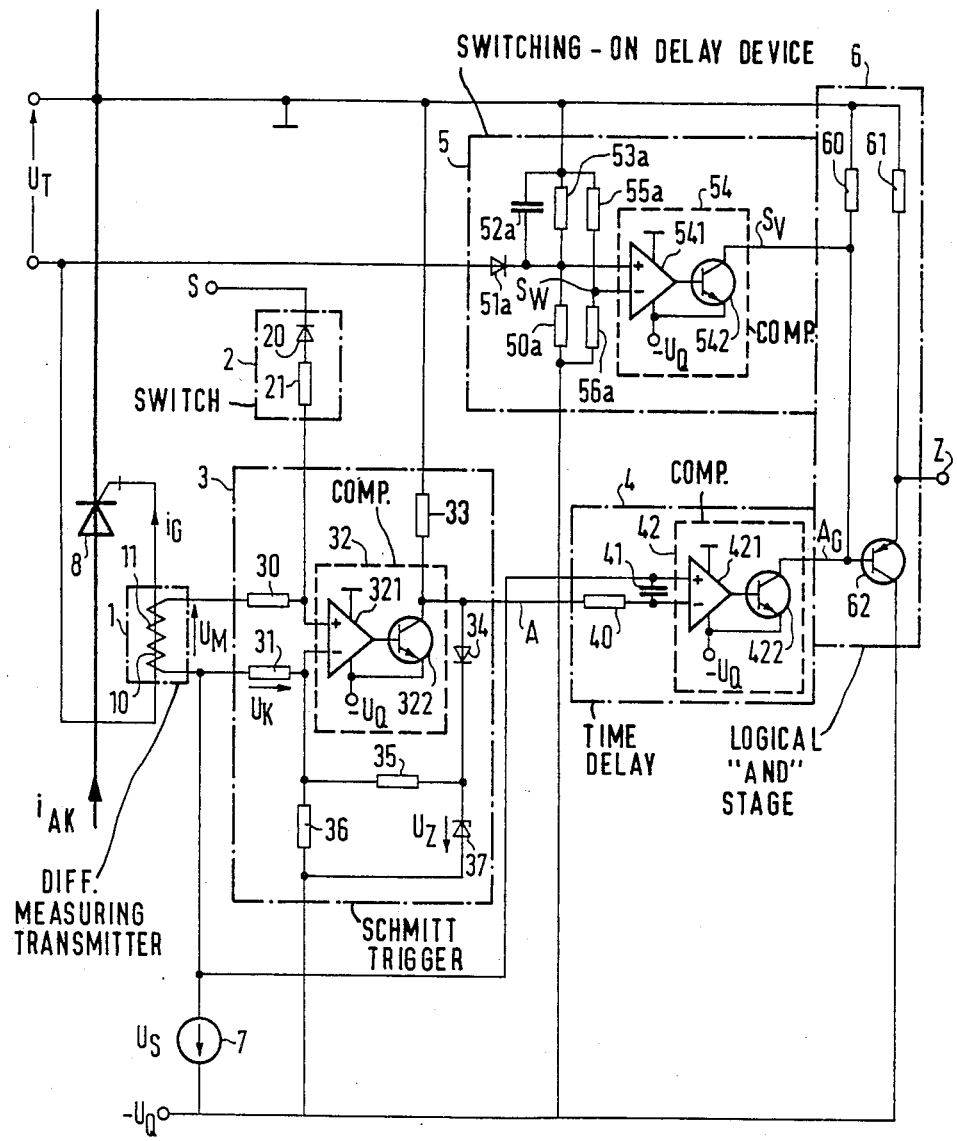
FIG. 8 is a circuit diagram of a suitable embodiment of a further preferred device.

FIG. 8, finally, shown the modifications of the embodiment of FIG. 6 which are necessary to take into consideration the further embodiment of the method according to FIG. 7. A switching voltage $U_T$ which comes from the driver and is referred to the potential of the thyristor cathode, is negative in the case of a thyristor turn-off and is monitored for the lower threshold $S_W$ by the signal transmitter 5. Its value is determined by the magnitude of the two resistors 55a and 56a which are connected as a voltage divider to the inverting input of the comparator 54. The turn-on delay with the time $T_V$ is formed, similarly to the device shown in FIG. 6, by the diode 51a, the capacitor 52a, and the two resistors 53a and 50a at the non-inverting input of the comparator 54. The charging time constant in the R-C member, consisting of the elements 52a, 53a and 50a determines the value of the delay time $T_V$. The capacitor 52a is likewise discharged in short-circuit fashion by the diode 51a when the turn-off signal disappears, i.e., if the switching voltage $U_T$ is positive, whereby the signal $S_V$ is switched into the inactive state almost without delay.

With the method and apparatus according to the invention the advent of the current blocking switching state of a GTO thyristor after the occurrence of a turn-off command is recognized in a simple and operationally reliable manner but also, if it is absent in the case of an unsuccessful switching-off attempt due to alloyed-through semiconductor layers or in the case of a defect in the driver, so that the sequential firing of adjacent thyristors in converter units can take place in optimum time by an adaptive mutual interlock or, in the case of one of the above-mentioned defects, protective measures for the rest of the circuit can be initiated in time.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than a restrictive sense.

What is claimed is:

1. A method for recognizing the cutoff state of a thyristor which can be switched off (GTO thyristor) having a cathode, anode and control gate and for determining if the thyristor is alloyed-through after an unsuccessful turn-off attempt, comprising the steps of forming, after a turn-off signal has been supplied to the gate of the thyristor, a state signal characterizing the occurrence of the shut-off state from the derivative in time of the gate current, and providing said state signal when the sign of the derivative in time of the gate current reverses and exceeds a predetermined positive limit which is chosen larger than the maximum positive value of the derivative in time of the gate current during a turn-off attempt occurring in the case of a GTO thyristor which is alloyed-through.

2. The method recited in claim 1, further comprising the steps of generating, with the occurrence of a turn-off signal at the output of driver means which is connected to the gate and cathode electrode of the thyristor, a negative switching voltage which initiates the switching off of the thyristor and forming the state signal if this switching voltage has fallen below a suitably chosen lower threshold.

3. The method recited in claim 2, wherein, taking parasitic inductances internal to the driver means into consideration, the lower threshold is chosen so that, with proper functioning of the driver means, the negative switching voltage falls reliably below the lower threshold at the instant of the occurrence of the turn-off signal.

4. The method recited in claim 1, wherein the state signal is not released as long as an adjustable delay time which is started at the beginning of the process of forming the state signal has not yet been terminated and if the derivative in time of the gate current has not fallen below a predetermined negative limit at the beginning of the turn-off.

5. The method recited in claim 4, wherein the predetermined negative limit and the adjustable delay time are matched to each other such that the derivative in time of the gate current falls below the predetermined negative limit before the delay time has expired.

6. The method recited in claim 1, further comprising the step of filtering out the effect of pulse-like disturbances of the gate current for preventing the erroneous release of the state signal.

7. The method recited in claim 1, further comprising the step of blocking the formation of the state signal simultaneously with the end of the thyristor turn-off signal.

8. Apparatus for recognizing the cut-off state of a thyristor which can be switched off (GTO thyristor) by a turn-off signal, the thyristor having a cathode, anode and control gate, for determining if the thyristor is alloyed-through after an unsuccessful turn-off attempt, and for forming a state signal characterizing the occurrence of the cut-off state from the derivative in time of the current flowing into the gate of the thyristor, comprising:
    differentiating measuring means for forming the derivative in time of the gate current;
    Schmitt trigger means having a predetermined positive and negative switching limit for generating a binary signal from the derivative in time of the gate current, whereby said Schmitt trigger means generates said binary signal when the sign of said derivative reverses and exceeds the predetermined positive limit, said predetermined positive limit chosen larger than the maximum positive value of the derivative in time of the gate current during a turn-off attempt occurring in the case of a GTO thyristor which is alloyed-through;
    means for forming an auxiliary signal directly from the thyristor turn-off signal having a delayed turn-on and comprising adjustable time delay means; and
    logic means for combining the binary signal and the auxiliary signal to form the state signal.

9. The apparatus recited in claim 8, further comprising time delay means serving as filter means for suppressing temporary changes of the binary signal which are caused by pulse-like disturbances of the gate current and which are shorter than a time constant of the filter means which is predeterminable via time delay means, whereby erroneous triggering of the state signal is prevented.

10. The apparatus recited in claim 8, further comprising means for blocking the state signal at the end of the thyristor turn-off signal by deactivation of an input to said Schmitt trigger means.

11. The apparatus recited in claim 8, wherein said differentiating measuring means comprises coupling inductance means permeated by the magnetic field of a primary winding, through which the gate current flows.

12. The apparatus recited in claim 11, wherein the coupling inductance means comprises a two-dimensional structure on a circuit board.

13. Apparatus for recognizing the cut-off state of a thyristor which can be switched off (GTO thyristor) by a turn-off signal, the thyristor having a cathode, anode and control gate, for determining if the thyristor is alloyed-through after an unsuccessful turn-off attempt and for forming a state signal characterizing the occurrence of the cut-off state from the derivative in time of the current flowing into the gate of the thyristor, comprising:
    driver means addressed by the turn-off signal for supplying the thyristor with a negative switching voltage between its gate and cathode electrode;
    differentiating measuring means for forming the derivative in time of the gate current;
    Schmitt trigger means having a predetermined positive and negative switching limit for providing a binary signal from the derivative in time of the gate current, whereby said Schmitt-trigger means generates said binary signal when the sign of said derivative reverses and exceeds the predetermined positive limit, said predetermined positive limit chosen larger than the maximum positive value of the derivative in time of the gate current during a turn-off attempt occurring in the case of GTO thyristor which is alloyed-through;
    comparator means for monitoring a switching voltage at the output of the driver means for an adjustable lower threshold;
    means for generating an auxiliary signal having a switch-on delay via an adjustable delay time which is triggered by an output of said comparator means; and
    logic means for combining the binary signal and the auxiliary signal to form the state signal.

14. The apparatus recited in claim 13, further comprising time delay means serving as filter means for suppressing temporary changes of the binary signal which are caused by pulse-like disturbances of the gate current and which are shorter than a time constant of the filter means which is predeterminable via time delay means, whereby erroneous triggering of the state signal is prevented.

15. The apparatus recited in claim 13, further comprising means for blocking the state signal at the end of the thyristor turn-off signal by deactivation of an input to said Schmitt trigger means.

16. The apparatus recited in claim 13, wherein said differentiating measuring means comprises coupling inductance means permeated by the magnetic field of a primary winding, through which the gate current flows.

17. The apparatus recited in claim 16, wherein the coupling inductance means comprises a two-dimensional structure on a circuit board.

* * * * *